(12) United States Patent
Alanen et al.

(10) Patent No.: US 7,796,953 B2
(45) Date of Patent: Sep. 14, 2010

(54) TRANSMITTER, POWER AMPLIFIER AND FILTERING METHOD

(75) Inventors: Marko J. Alanen, Espoo (FI); Sami Vilhonen, Littoinen (FI); Ari Vilander, Kerava (FI)

(73) Assignee: Nokia Corporation, Espoo (FI)

( * ) Notice: Subject to any disclaimer, the term of this patent is extended or adjusted under 35 U.S.C. 154(b) by 1216 days.

(21) Appl. No.: 11/378,135

(22) Filed: Mar. 17, 2006

(65) Prior Publication Data
US 2007/0218844 A1 Sep. 20, 2007

(51) Int. Cl.
H04B 1/38 (2006.01)
(52) U.S. Cl. ............... 455/73; 455/107; 455/127.3; 375/315; 330/301; 330/302
(58) Field of Classification Search ............ 455/73, 455/91, 107, 120, 124, 125, 316, 323, 338; 375/315; 330/301, 302, 303, 307, 310
See application file for complete search history.

(56) References Cited

U.S. PATENT DOCUMENTS 5,963,858 A * 10/1999 Seely .................. 455/326
6,195,536 B1 * 2/2001 Peckham et al. ......... 455/127.4
6,526,262 B1   2/2003 Kurlovich
6,792,250 B1   9/2004 Zarubin
7,027,743 B1 * 4/2006 Tucker et al. ............ 398/204
2003/0141927 A1 * 7/2003 Barnett ................... 330/129
2004/0213573 A1  10/2004 Schemmann et al.

FOREIGN PATENT DOCUMENTS

JP           2000138546        5/2000

OTHER PUBLICATIONS

Oct. 2005, Oualkadi et al., "High-Q 8-Path bandpass filters design for broadband wireless radio-communication", The European Conference on Wireless Technology, Oct. 3-4, 2005.
2005, Jarvinen et al., "GaAs HBT Class-E Amplifiers for 2-GHz Mobile Applications", Radio Frequency Integrated Circuits (RFIC) Symposium 2005. Digest of Papers. 2005 IEEE, Piscataway, NJ, Jun. 12, 2005, pp. 421-424.

* cited by examiner

Primary Examiner—Tuan H Nguyen
(74) Attorney, Agent, or Firm—Hollingsworth & Funk, LLC

(57) ABSTRACT

A filtering method, a transceiver and a transmitter are provided. The transmitter comprises a power amplifier amplifying an RF signal and having multiple stages, and a local oscillator, the power amplifier comprising between at least two stages of the power amplifier an impedance circuitry for forming an impedance at a frequency related to the frequency of the local oscillator, and a switch for switching the impedance of the impedance circuitry means to RF frequency.

15 Claims, 3 Drawing Sheets

TRANSMITTER, POWER AMPLIFIER AND FILTERING METHOD

FIELD

The invention relates to filtering in transmitters and power amplifiers in transceivers, especially in RF transmitters and RF power amplifiers.

BACKGROUND

In multiradio concepts, where the number of different radio systems is increasing all the time, the interoperability of different radio systems is challenging. Different radio systems operating on different frequency bands are required to operate properly without disturbing each other, even if they are operating at the same time. This sets strict requirements for both receiver and transmitter chains especially in transceivers when a transmitter of a transceiver is having high power levels at the same time when a receiver of a transceiver is receiving a weak signal.

In the transmitter, a power amplifier is used to amplify the signal to be transmitted to the required power level. However, power amplifiers have usually a broad bandwidth. Therefore, they amplify the signal to be transmitted not only on the desired transmitter band but also outside the desired band. In such a case, an unwanted receiver band may be amplified with the same gain. After the power amplifier, there has to be a tight filter that filters these unwanted receiver band signals away before transmitting the power from the antenna. The requirements of such filters are strict causing losses also to the transmitter path. This, in turn, has to be compensated for with increased output power from the power amplifier. This decreases the total transmitter efficiency and leads to increased power consumption and increased heat in portable transmitters such as mobile phones.

Furthermore, the noise requirements for the transmitter path before power amplifier are very strict so as to guarantee that the noise level before the power amplifier will not be too high. This is required to ensure that the filters after the power amplifier can reduce the receiver band noise level to be low enough. If no filtering is performed before the power amplifier, the capability of the filters after the power amplifier sets a limit to the maximum gain of the power amplifier and can increase the required output power of the transceiver block before the power amplifier.

Traditionally, most of the unwanted noise filtering is performed after the power amplifier in a front-end module of the transmitter, which consists of switches and filters. Since the gain of the power amplifier is constant in both transmitter and receiver bands, it sets strict requirements for the filter after the power amplifier to decrease the signal level in receiver bands.

FIG. 1 illustrates a section of a traditional front end of a transmitter. The front end comprises a power amplifier 100 and a band pass filter 102 connected to the output of the power amplifier. The power amplifier comprises multiple amplifier stages 104, 106 and a matching circuit 108 after the stages. FIG. 2A illustrates an RF signal and noise strengths at the input of the power amplifier. Frequency is shown on the X-axis and signal strength is shown on the y-axis. A TX-arrow 200 denotes the signal strength on the desired transmission frequency. In addition, noise level 202 is shown. RX denotes the receiver band. FIG. 2B illustrates the RF signal strength at the output of the power amplifier. The RF-signal has been amplified on all frequency bands, as the power amplifier is a broadband amplifier. Both the desired transmission 202 and the noise signal 202 have been amplified. FIG. 2C illustrates the RF signal strength at the output of the band pass filter 102. The noise signal strength 202 on the RX band has been somewhat reduced.

BRIEF DESCRIPTION OF THE INVENTION

An object of the invention is to provide an improved solution for filtering in a transmitter and a power amplifier. According to an aspect of the invention, there is provided a transmitter comprising a power amplifier amplifying an RF signal and having multiple stages, and a local oscillator, the power amplifier comprising between at least two stages of the power amplifier an impedance circuitry for forming an impedance at a frequency related to the frequency of the local oscillator, and a switch for switching the impedance of the impedance circuitry means to RF frequency.

According to another aspect of the invention, there is provided a power amplifier in a transmitter comprising a local oscillator, the power amplifier amplifying an RF signal and having multiple stages, the power amplifier comprising between at least two stages of the power amplifier impedance circuitry means for forming an impedance at a frequency related to the frequency of the local oscillator, and switching means for switching the impedance of the impedance circuitry means to the RF frequency.

According to another aspect of the invention, there is provided a power amplifier in a transmitter comprising a local oscillator, the power amplifier amplifying an RF signal and having multiple stages, the power amplifier comprising between at least two stages of the power amplifier an impedance circuitry for forming an impedance at a frequency related to the frequency of the local oscillator, and a switch for switching the impedance of the impedance circuitry means to RF frequency.

According to another aspect of the invention, there is provided a filtering method, the method comprising: amplifying an RF signal in multiple amplifying stages of a power amplifier, forming an impedance in an impedance circuitry between at least two stages at a frequency related to the frequency of the local oscillator of the receiver, and switching the formed impedance to the RF frequency.

According to another aspect of the invention, there is provided a filtering method in a transmitter, the method comprising: amplifying an RF signal in multiple amplifying stages of a power amplifier of the transmitter, forming an impedance in an impedance circuitry between at least two stages at a frequency related to the frequency of the local oscillator of the receiver, and switching with a switch arrangement the created impedance to the RF frequency.

According to yet another aspect of the invention, there is provided a transceiver comprising a transmitter with a power amplifier amplifying an RF signal and having multiple stages, and a local oscillator, the power amplifier comprising between at least two stages of the power amplifier impedance circuitry means for forming an impedance at a frequency related to the frequency of the local oscillator, and switching means for switching the impedance of the impedance circuitry means to the RF frequency.

The embodiments of the invention provide several advantages. The filtering requirements after the power amplifier can be relaxed. In transceivers, receiver-band filtering requirements of the duplex filters can be relaxed. This relaxed requirement for attenuation decreases also the transmitter band losses in the duplex filter which in turn increases the total transmitter chain efficiency. Approximately an increase of 1% in power amplifier efficiency can be reached if the losses at the transmitter chain after the power amplifier decrease 0.1 dB. Thus, already a saving of 0.5 dB in losses may increase the power amplifier efficiency with 5% units. This decreases the heat that the power amplifier generates and, therefore, also the reliability of the power amplifier is increased. Furthermore, the gain of the power amplifier can be increased without adding extra filter at the input of the power amplifier. This means that the required output power from a radio frequency integrated circuit (RFIC) may be reduced.

The design of the proposed filtering arrangement is simple and it may be configured to be used on different frequency bands with minimal changes. The change of the frequency band used may be performed by software.

LIST OF DRAWINGS

In the following, the invention will be described in greater detail with reference to the embodiments and the accompanying drawings, in which FIG. 1 illustrates an example of the front end of a prior art transmitter;

DESCRIPTION OF EMBODIMENTS

Figure 3:
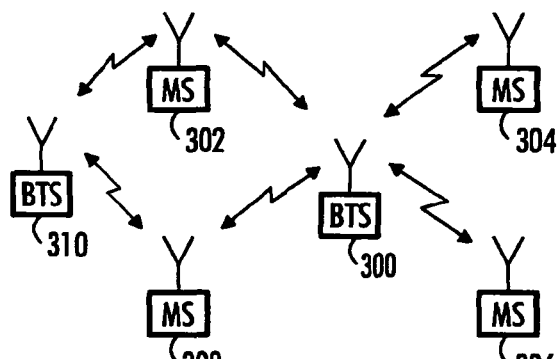
FIG. 3 illustrates an example of a telecommunication system in which embodiments of the invention are applicable.

With reference to FIG. 3, let us examine an example of a telecommunication system in which embodiments of the invention are applicable. FIG. 3 shows a base station 300 which is in connection with terminal equipment 302, 304, 306 and 308. The terminal equipment 302 and 308 may also be in contact with another base station 310. The base station 300 and the terminal equipment 302, 304, 306 and 308 comprise an RF transceiver. Embodiments of the invention may be applied both in base stations and in terminal equipment.

Different multiple access methods may be used in the telecommunication system in which embodiments of the invention are applicable. The system may utilize CDMA (Code Division Multiple Access) WCDMA (Wide CDMA) or TDMA (Time Division Multiple Access). The access method used is not relevant regarding the embodiments of the invention.

Embodiments of the invention are not limited to transmitters, transceivers or power amplifiers of transmitters of telecommunication systems, but they may be applied to any transmitter, transceiver and power amplifier of a transmitter, especially to an RF transceiver, an RF transmitter and an RF power amplifier.

Figure 4:
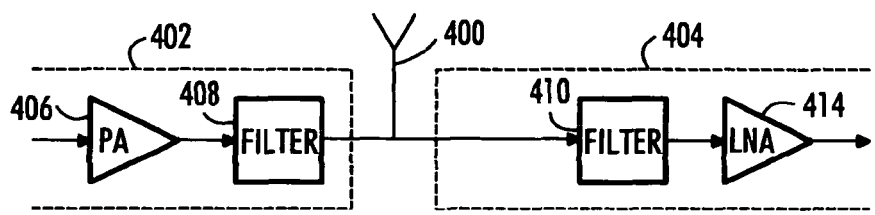
FIG. 4 illustrates an example of the front end of a transceiver in which embodiments of the invention are applicable.

FIG. 4 illustrates an example of the front end of a transceiver in which embodiments of the invention are applicable. The transceiver comprises an antenna 400 connected to a transmitter 402 and a receiver 404. The front end of the transmitter 402 comprises a power amplifier 406 and an external filter 408 between the antenna and the amplifier. The filter may be a SAW or a BAW filter, which blocks the signal received by the receiver 404 to reach the power amplifier 406 of the transmitter 402 and filters the signal amplified by the power amplifier. Also other filter arrangements may be used. The front end of the receiver 404 comprises a pass band filter 410 and a low noise amplifier 414 placed in series.

Figure 5:
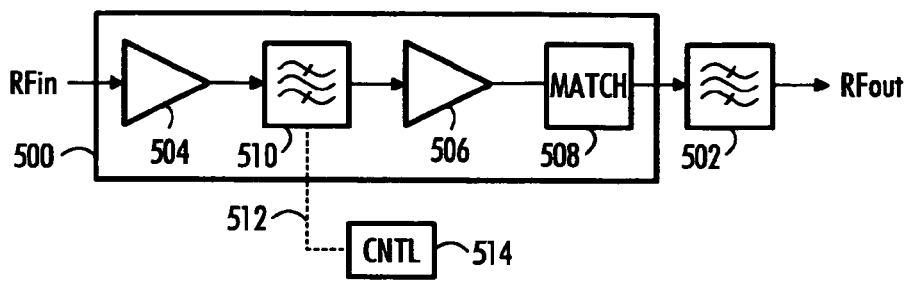
FIG. 5 illustrates an example of the front end of a transmitter of an embodiment of the invention.

FIG. 5 illustrates a section of the front end of a transmitter according to an embodiment of the invention. The front end comprises a power amplifier 500 and a band pass filter 502 connected to the output of the power amplifier. Also, a controller unit 514 of the transmitter is shown in FIG. 5. The power amplifier 500 comprises multiple amplifier stages 504, 506 and a matching circuit 508 connected to the output of the last stage. The power amplifier further comprises a band pass filter 510 between at least two amplifying stages of the power amplifier 500. In this embodiment, filtering is performed inside the power amplifier stages so that the filtering requirements of the filter after the power amplifier may be decreased. In addition, the output power and the noise requirements of the transmitter path before power amplifier are decreased.

The band pass filter 510 may be tunable so that the same power amplifier may be used for different bands and modes, such as GSM1800, GSM1900, WCDMA1900 and WCDMA2100. The filter 510 may be tunable with frequency and bandwidth. The filter may be controlled by a control signal 512 originated from a controller unit 514 of the transmitter, for example.

Figure 1:
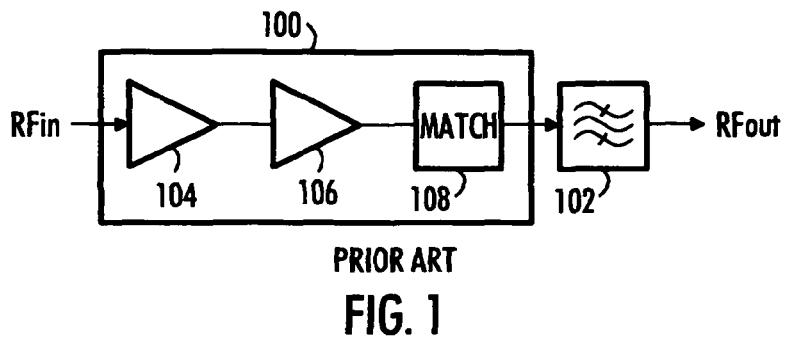
Figure 2A:
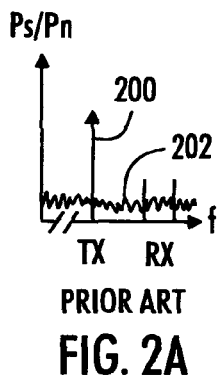
FIGS. 2A to 2C illustrate examples of signal strength on different parts of the prior art transmitter.
Figure 2B:
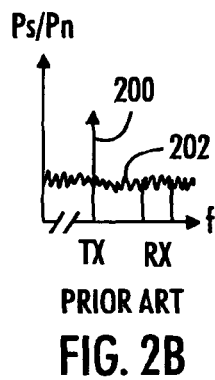
Figure 2C:
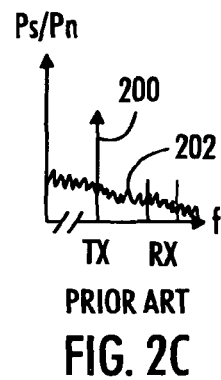
Figure 6A:
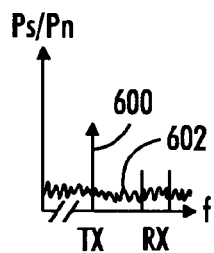
FIGS. 6A to 6C illustrate examples of signal strength on different parts of the transmitter of an embodiment of the invention.
Figure 6B:
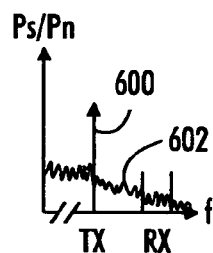
Figure 6C:
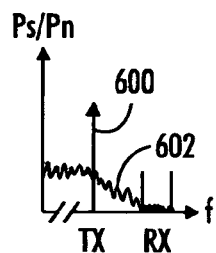

FIG. 6A illustrates the RF signal strength and noise strengths at the input of the power amplifier 500. Frequency is shown on the X-axis and signal strength is shown on the y-axis. A TX-arrow 600 denotes the signal strength on the desired transmission frequency. In addition, a noise level 602 is shown. RX denotes a receiver band. FIG. 6B illustrates the RF signal strength at the output of the power amplifier 500. The RF-signal has been amplified at all frequency bands, as the power amplifier is a broadband amplifier. However, due to the band pass filter 510, the noise signal 602 at the RX receiver band frequencies has been attenuated considerably in comparison with the prior art solution of FIG. 2B. FIG. 6C illustrates the RF signal strength at the output of the band pass filter 502. The noise signal 602 strength at the RX band has been reduced even more and the attenuation is better in comparison with the prior art solution of FIG. 2C.

Figure 7:
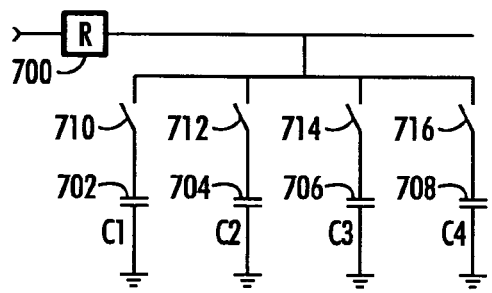
FIG. 7 illustrates an example of a tunable band pass filter of an embodiment of the invention.

FIG. 7 illustrates an example of a band pass filter 510. The filter comprises a resistor 700 having a resistance of R and four capacitors 702, 704, 706 and 708 placed in parallel. The capacitors have capacitances C1, C2, C3 and C4, respectively. Each capacitor is placed behind a switch 710, 712, 714, and 716. The switches are controlled to switch the four parallel capacitors alternately so that each of them is on 25% of the time cycle. The switching frequency of the capacitor switches 710, 712, 714, and 716 is related to the local oscillator frequency. If the input RF frequency differs from the switching frequency of the capacitor switches 710, 712, 714, and 716, the capacitors are charged with the frequency difference and create a band pass filter response with a corner frequency of $$\tau = \frac{1}{2\pi RC},$$

where C=C1+C2+C3+C4.

Figure 8:
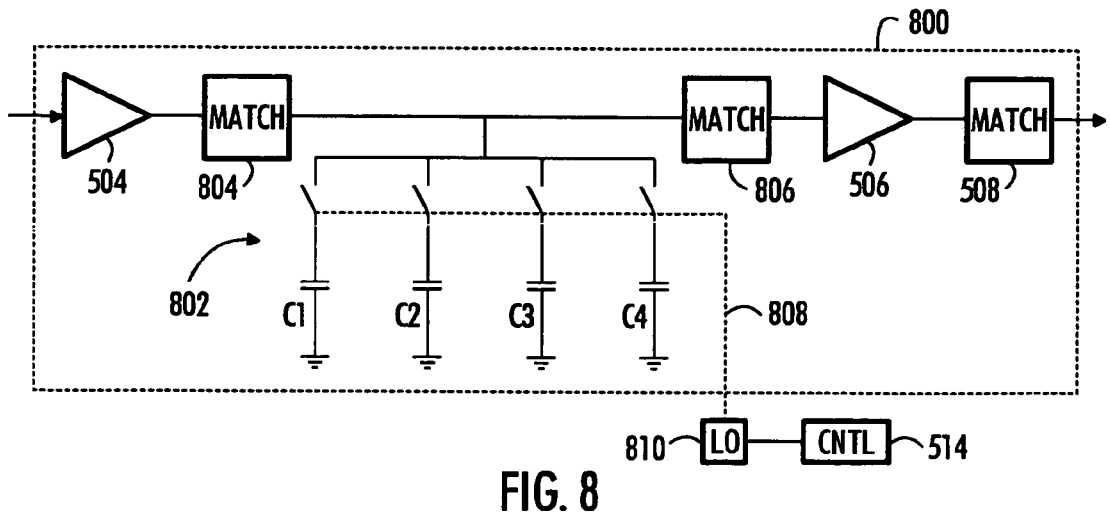
FIG. 8 illustrates another example of a power amplifier of the front end of a transmitter according to an embodiment of the invention.

FIG. 8 illustrates a power amplifier 800 of the front end of a transmitter according to an embodiment of the invention. Here, the band pass filter of FIG. 7 is used. The power amplifier comprises multiple amplifier stages 504, 506 and a matching circuit 508 connected to the output of the last stage. The power amplifier further comprises a band pass filter 802 connected between at least two amplifying stages 504, 506 of the power amplifier. The filter comprises capacitors and switches as described in connection with FIG. 7. The power amplifier further comprises matching circuits 804, 806 before and after the band pass filter 802.

The filter 802 may be tuned to different frequency bands by adjusting the frequency of the signal 808 which controls the switches. The frequency may be derived from local oscillator 810 of the transmitter and it may be controlled by the controller unit 514 of the transmitter, for example.

Figure 9A:
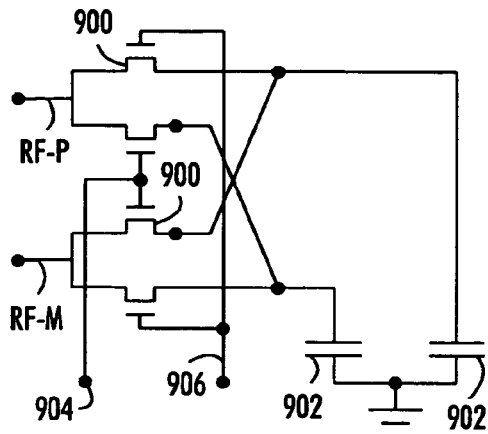
FIGS. 9A to 9C illustrate another examples of a band pass filter.
Figure 9B:
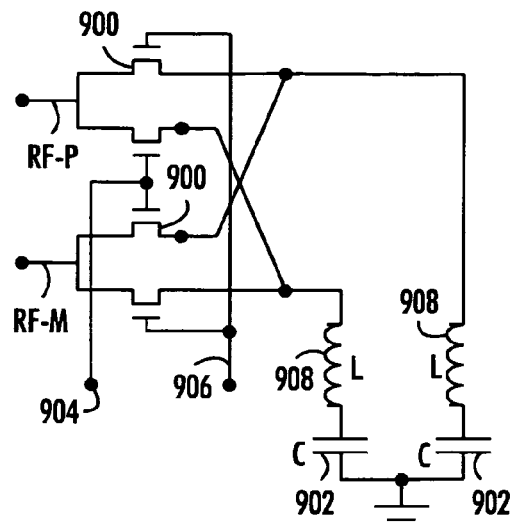
Figure 9C:
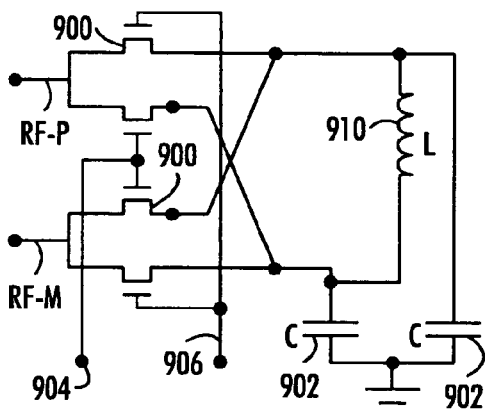

The operation of the band pass filter 510 between at least two amplifying stages of the power amplifier is further described in FIGS. 9A, 9B and 9C which are examples among others of a simplified schematic view of the filter 510. The embodiments of FIGS. 9A, 9B and 9C use MOSFETs (metal-oxide-semiconductor field-effect transistors) as switches.

In an embodiment of the invention shown in FIG. 9A, the filter comprises MOSFET switches 900, which are switched with signals 904, 906 between on and off states. The frequency of the signals 904, 906 is related to LO (local oscillator) signal. The filter further comprises capacitors C 902 connected to the switches 900. As the MOSFETs 900 are switched between on and off states the capacitors are then switched between RF-P and RF-M ports which act as input to the MOSFETs. Referring to FIG. 8, the ports RF-P and RF-M receive a signal from the matching circuit 804 having resistance R. It should be noted here that the resistance may be a general impedance of the form: Z=a+bj ohms.

In an embodiment of the invention, the frequency of the signals 904 and 906 is not exactly the same as the frequency of a local oscillator signal but derived from it.

If the frequency of the incoming RF signals in ports RF-P and RF-M differ from the frequency of the signals 904, 906, then the capacitors C 902 will be charged with a signal the frequency of which is the difference of the RF and signals 904, 906. The driving impedance is the impedance R of the matching circuit 804. Therefore the result is impedance filtering at frequency $F_{LO}+F_{RC}$, where $F_{LO}$ is the LO-signal frequency and $F_{RC}$ is the corner frequency of the resistance R and the capacitor C 902 (i.e., ½πRC).

This means that the filter 510 is a band pass filter with pass band corner frequencies (also called −3 dB frequencies or half-power frequencies) $F_{LO}+F_{RC}$ and $F_{LO}-F_{RC}$, respectively.

The shape of the filter 510 is very steep, since the attenuation increases as a function of the RC constant corresponding to the low frequencies. Let us study an example. If the LO frequency is 2 GHz and an RC time constant is equivalent to 2 MHz, then the signal of frequency 2.002 GHz attenuates 3 dB. If we had a standard RC −3 dB point at that frequency, 20 dB attenuation would be reached at the frequency of about 20.002 GHz (i.e. one decade away). With the transferred-impedance filter 510, the 20 dB attenuation will be reached at 2.020 GHz (i.e. one decade away from the RC frequency 2 MHz). Thus the low frequency (defined by the RC constant) is transferred to the RF frequencies. This is a significant improvement over the possible prior art solutions.

Thus, in an embodiment of the invention, the filter comprises means for forming impedance at a frequency derived from the frequency of the local oscillator and switches for switching the impedance to the RF frequency.

It is noted that other impedances can be transferred to higher frequency filtering using the methodology described in the present invention. In the embodiment of FIG. 9A, capacitors 902 were used as impedance in the filter 510. However, any impedance Z may replace the capacitors. The capacitors 902 in FIG. 9A can be replaced with an LC-resonator or with a combination of capacitors and an amplifier, for example. FIGS. 9B and 9C demonstrate LC resonator options.

In the embodiment of FIG. 9B, inductors L 908 are added in series with the capacitors C 902 (compared to FIG. 9A) and the center frequency of the filter (or a reference frequency) is given by $F_{LO}-F_{LC}$ or $F_{LO}+F_{LC}$, wherein $F_{LO}$ is the local oscillator frequency 904, 906 provided to the filter 510 and $F_{LC}$ is an LC resonant frequency given by $F_{LC}=½π\sqrt{LC}$. $F_{LC}$ can be made as low as 900 kHz, for example. In this case, the resultant center frequency of the filter could be $F_{LO}$−900 kHz or $F_{LO}$+900 Hz.

Moreover, according to an embodiment shown in FIG. 9C, an inductor L 910 is added in parallel with the capacitors C 902 (compared to FIG. 4A) with an LC resonant frequency $F_{LC}$ given by $F_{LC}=½π\sqrt{LC}$. It is noted that for the resonant curve with the center frequencies $F_{LO}+F_{LC}$ and $F_{LO}-F_{LC}$, the corner frequencies (−3 dB frequencies) of the pass band depends on the inductor L 910 (in addition to being a function of the resistance R and the capacitors C 902). Thus, if the inductor L 910 and the capacitor C 902 are placed in parallel, then there are narrow pass bands around the resonant frequency at $F_{LO}+F_{LC}$ and $F_{LO}-F_{LC}$ where $F_{LC}=½π\sqrt{LC}$.

The inductors 908 or 910 can be generated, e.g. from capacitors with operational amplifiers (which imitate inductors) or by making a second (or higher) order filter by generating an impedance with a magnitude degrading as a second order filter response thus providing a low area, high performance filter systems.

There are a lot of variations of the above-presented structure of the filter 510. It is noted that the NMOS switches used in examples of FIGS. 9A, 9B and 9C can be of other types.

Also, it is clearly understood that the technology described in the invention can provide a broad range of LC resonant frequencies and impedances transferred to filtering of radio frequencies, according to the present invention. Furthermore, the examples presented in the above-described Figures use differential (i.e., both positive and negative) signals but the method of the present invention can be also used in single-ended systems with only one signal line.

The frequency of the signals 904, 906 is related to LO (local oscillator) signal. The frequency may be derived from the frequency of the local oscillator signal or it may be locked to the frequency of the local oscillator signal. The signals may be generated in the local oscillator or in a separate oscillator.

Figure 10:
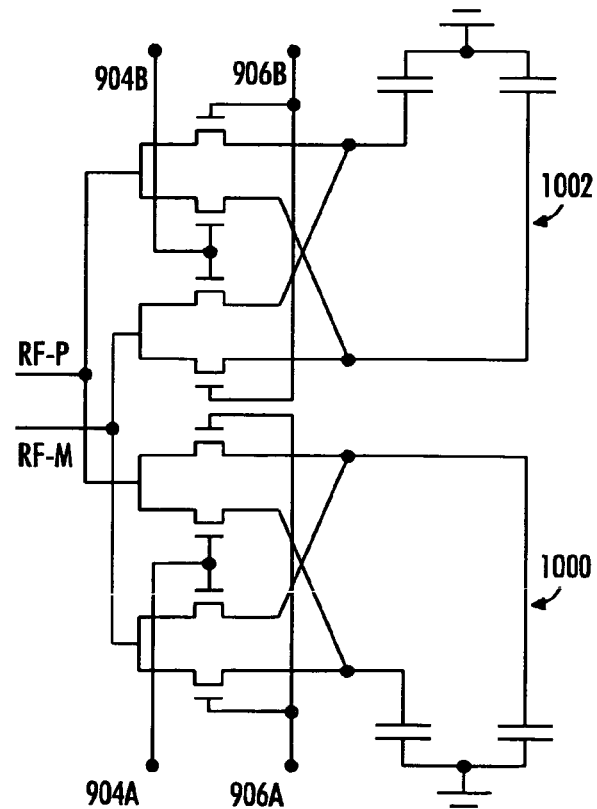
FIG. 10 illustrates yet another example of a band pass filter.

FIG. 10 illustrates a more complete example of a band pass filter 510. In the example of FIG. 10, the filter comprises separate I- and Q-branches 1000, 1002. As input there are signals RF-P and RF-M as in the example of FIG. 9A. In this embodiment, there are four signals derived from local oscillator signal. On the I-branch 1000 of the filter there are $F_{LO-IP}$ 904A and $F_{LO-IM}$ 906A. On the Q-branch 1002 of the filter there are $F_{LO-QP}$ 904B and $F_{LO-QM}$ 906B. The phase difference of $F_{LO-IP}$ and $F_{LO-QP}$ is 90 degrees, and the phase difference of $F_{LO-IM}$ and $F_{LO-QM}$ is like wise 90 degrees. The phase difference of $F_{LO-IP}$ and $F_{LO-IM}$ is 180 degrees and the phase difference of $F_{LO-QP}$ and $F_{LO-QM}$ is like wise 90 degrees.

In an embodiment, the invention is applied to a multiband transceiver which supports several frequency bands. The transceiver may comprise more than one local oscillator.

When the transceiver is transmitting and receiving on a given frequency band, the local oscillator of the given band is used and switched to the filter 510. The switching may be performed under control of the controller unit 514.

Even though the invention has been described above with reference to an example according to the accompanying drawings, it is clear that the invention is not restricted thereto but it can be modified in various ways within the scope of the appended claims.

The invention claimed is:

1. A transmitter comprising a power amplifier amplifying an RF signal and having multiple stages, and a local oscillator, the power amplifier comprising between at least two stages of the power amplifier
    an impedance circuitry for forming a band pass impedance having corner frequencies defined by a frequency related to the frequency of the local oscillator, and
    a switch for transferring the impedance of the impedance circuitry means to RF frequency.

2. The transmitter of claim 1, comprising at least one control signal controlling the switch, the control signal having a frequency related to the frequency of the local oscillator.

3. The transmitter of claim 1, comprising controlling means for controlling the frequency related to the frequency of the local oscillator.

4. The transmitter of claim 1, wherein the impedance circuitry is realized with capacitors.

5. The transmitter of claim 1, wherein the RF parts of the transmitter are integrated on an integrated circuit and the switch and the impedance circuitry are integrated into the same chip.

6. A power amplifier in a transmitter comprising a local oscillator, the power amplifier amplifying an RF signal and having multiple stages, the power amplifier comprising between at least two stages of the power amplifier
    impedance circuitry means for forming a band pass impedance having corner frequencies defined by a frequency related to the frequency of the local oscillator, and
    switching means for transferring the impedance of the impedance circuitry means to the RF frequency.

7. The power amplifier of claim 6, comprising at least one control signal controlling the switching means, the control signal having a frequency related to the frequency of the local oscillator.

8. A power amplifier in a transmitter comprising a local oscillator, the power amplifier amplifying an RF signal and having multiple stages, the power amplifier comprising between at least two stages of the power amplifier
    an impedance circuitry for forming a band pass impedance having corner frequencies defined by a frequency related to the frequency of the local oscillator, and
    a switch for transferring the impedance of the impedance circuitry means to RF frequency.

9. A filtering method, the method comprising:
    amplifying an RF signal in multiple amplifying stages of a power amplifier,
    forming a band pass impedance in an impedance circuitry between at least two stages and having corner frequencies defined by a frequency related to the frequency of a local oscillator of a receiver, and
    transferring the formed impedance to the frequency of the RF signal.

10. The method of claim 9, wherein the switching is controlled by at least one control signal having a frequency related to the frequency of the local oscillator of the receiver.

11. The method of claim 9, further comprising
    controlling the center frequency of the pass band of a filter by adjusting the frequency related to the frequency of the local oscillator of the receiver.

12. The method of claim 9, wherein the frequency related to the frequency of the local oscillator is derived from the frequency of the local oscillator.

13. The method of claim 9, wherein the frequency related to the frequency of the local oscillator is locked to the frequency of the local oscillator.

14. A filtering method in a transmitter, the method comprising:
    amplifying an RF signal in multiple amplifying stages of a power amplifier of the transmitter,
    forming an impedance in a band pass impedance circuitry between at least two stages and having corner frequencies defined by a frequency related to the frequency of a local oscillator of a receiver, and
    transferring with a switch arrangement the formed impedance to the frequency of the RF signal.

15. A transceiver comprising a transmitter with a power amplifier amplifying an RF signal and having multiple stages, and a local oscillator, the power amplifier comprising between at least two stages of the power amplifier
    impedance circuitry means for forming a band pass impedance having corner frequencies defined by a frequency related to the frequency of the local oscillator, and
    transferring means for switching the impedance of the impedance circuitry means to the frequency of the RF signal.

* * * * *